US006652647B2

(12) United States Patent
Duffar et al.

(10) Patent No.: US 6,652,647 B2
(45) Date of Patent: Nov. 25, 2003

(54) CRYSTAL GROWTH DEVICE AND METHOD

(75) Inventors: Thierry Duffar, Grenoble (FR); Pierre Dusserre, Saint Egreve (FR); Nathalie Giacometti, Claix (FR)

(73) Assignees: Commissariat a l'Energie Atomique, Paris (FR); Centre National d'Etudes Spatiales, Paris (FR)

( * ) Notice: Subject to any disclaimer, the term of this patent is extended or adjusted under 35 U.S.C. 154(b) by 0 days.

(21) Appl. No.: 10/204,402

(22) PCT Filed: Mar. 9, 2001

(86) PCT No.: PCT/FR01/00708

§ 371 (c)(1),
(2), (4) Date: Aug. 27, 2002

(87) PCT Pub. No.: WO01/68956

PCT Pub. Date: Sep. 20, 2001

(65) Prior Publication Data

US 2003/0019421 A1 Jan. 30, 2003

(30) Foreign Application Priority Data

Mar. 10, 2000 (FR) .............................................. 00 03118

(51) Int. Cl.$^7$ .............................................. C30B 11/00
(52) U.S. Cl. .................................................. 117/81
(58) Field of Search ........................................ 117/81, 83

(56) References Cited

U.S. PATENT DOCUMENTS

| 4,764,350 | A | | 8/1988 | Adamski |
| 5,037,621 | A | | 8/1991 | Kennedy et al. |
| 6,302,959 | B2 | * | 10/2001 | Srivastava et al. ............ 117/81 |
| 6,334,897 | B1 | * | 1/2002 | Asahi et al. ................... 117/81 |
| 6,488,769 | B1 | * | 12/2002 | Oba ............................. 117/68 |

FOREIGN PATENT DOCUMENTS

| EP | 0 565 415 | 10/1993 |
| FR | 2 757 184 | 6/1998 |
| JP | 04 042888 | 2/1992 |

* cited by examiner

*Primary Examiner*—Felisa Hiteshew
(74) *Attorney, Agent, or Firm*—Oblon, Spivak, McClelland, Maier & Neustadt, P.C.

(57) ABSTRACT

The device according to invention comprises an ampoule (4) at the bottom of a crucible (3) for crystal growing by progressive solidification of a liquid, and a specific means of heating (9) to adjust the temperature of the volume of this gas pocket and establish an overpressure at the bottom of the crucible compared to the top in order to ensure a contraction of the crystal (2) at the moment of its solidification and to avoid defects in the crystals. By eliminating a pressure regulating circuit linking these two extreme regions in order to establish the overpressure directly, the lay out is considerably simplified and at the same time avoids condensations of the vaporised portions of the crystal in the pipes.

5 Claims, 1 Drawing Sheet

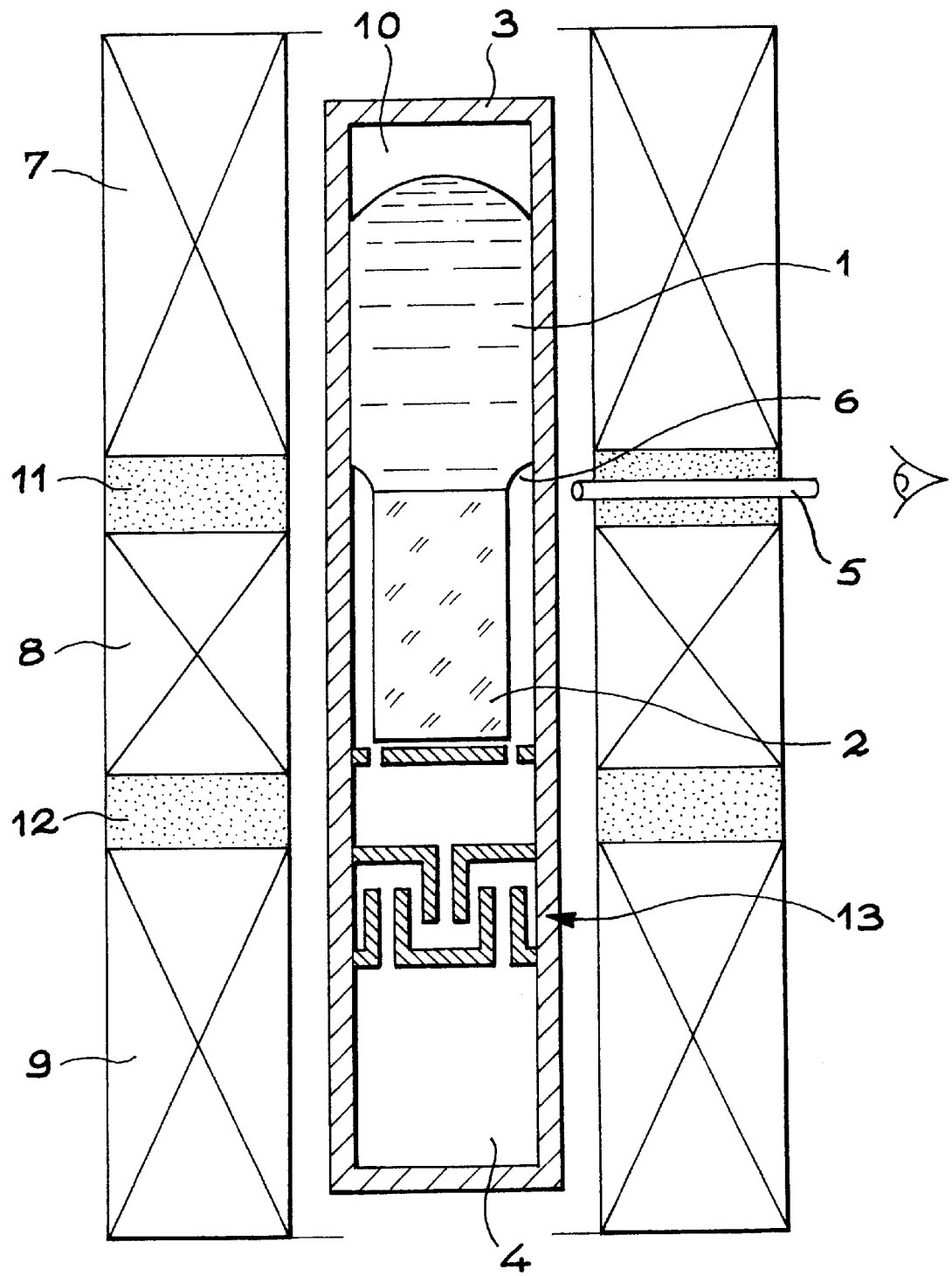

CRYSTAL GROWTH DEVICE AND METHOD

BACKGROUND OF THE INVENTION

1. Field of the Invention

This invention relates to a crystal growing device and method, in which a liquefied body with the composition of the crystal to be formed is enclosed in a crucible of which it wets the wall and left to solidify in the presence of a seed that has the crystalline structure to be created, so that this structure is reproduced by the body as it solidifies. In an embodiment of the method, an ingot of the body is deposited in the solid state in the crucible and it is liquefied by stages by a movable means of heating along the crucible while moving away from the seed: the body solidifies progressively from the seed, from which it again takes the crystalline structure. The original body thus transformed into a crystal is then recovered by opening the crucible. Several concrete examples of these methods have been conceived in industry.

2. Description of Related Art

French patent 2 757 184, which constitutes the nearest prior art, teaches that the solidification of the crystal causes certain difficulties since its coefficient of contraction is different to that of the crucible when it cools down, which produces mechanical stresses, defects in the crystals and sometimes a rupture of the crucible, even if it contracts less than the crystal, since it adheres to it. This patent also teaches that a solution may be found by producing a higher gas pressure in a bottom part of the crucible, where the crystal forms, than in an upper part of the crucible, which overhangs the liquid and is thus occupied by the gas. This overpressure automatically produces a contraction of the section of the crystal at the moment of its solidification, and thus a gap between the crystal and the crucible, which increases with the level of the crystal—liquid interface as the solidification progresses.

BRIEF SUMMARY OF THE INVENTION

This invention constitutes an improvement to the previous patent: although the known process enables the asserted objectives to be attained, it has certain disadvantages due to the existence of pipes leading to the two extreme regions of the crucible and which make it possible to establish the desired pressure difference. It must first of all be admitted that this grafting of a gas circuit onto the crucible imposes modifications to the apparatus and somewhat perturbs the heat exchanges: but above all, one observes condensations of the body that should form the crystal in the cold parts of the pipes when these bodies have a high vapour pressure, such as CdTe, GaAs, InP, GaP in particular. The composition of the crystal may be affected by this, and the pipes end up by becoming blocked. It would be conceivable to maintain the whole of the gas circuit at a sufficient temperature to preclude the condensation of these bodies, but the technical difficulties would be considerable due to the high temperature involved (1000° C. for example), and there is no pressure sensor, which is however necessary to adjust the pressure difference, which would resist such heat.

An essential aim of the invention is thus to do away with the gas circuit without doing away with the beneficial effect of the pressure difference between the two parts of the crucible. Henceforth one uses a crucible that is sealed but fitted with a gas pocket, called ampoule, heated by a specific means and adjustable, which makes it possible to modify the temperature of the gas at will. The ampoule communicates with the bottom part of the crucible and there establishes the desired overpressure via the heating of its contents. Thus, a pressure regulation is replaced by a temperature regulation, which is easier to accomplish in practice. A visual observation of the solidification and, in particular, the crystal—liquid interface makes it possible to ensure the overpressure is correct without having to resort to a sensor.

BRIEF DESCRIPTION OF THE DRAWING

FIG. 1 Crystal growing device.

DETAILED DESCRIPTION OF THE INVENTION

We will now describe the unique figure, which illustrates a possible embodiment of the invention. The body intended for crystal growing comprises a liquid portion 1 surmounting a crystal 2 solidified in a sealed crucible 3, of cylindrical shape and standing erect or leaning. The volume of the crucible 3 unoccupied by the liquid 1 and the crystal 2 is filled with a neutral gas, which does not react with the sample. The lower region of the crucible 3 is occupied by an ampoule 4 of this gas, which makes it possible to apply a pressure difference between the lower region of the crucible 3 and an upper region 10 overhanging the liquid 1 and also filled with the neutral gas, since the liquid 1 wets the wall of the crucible 3, while the crystal 2 resulting from a contraction on solidification is separated from this wall by a gap.

A heating device comprises three superimposed furnaces 7, 8 and 9, surrounding the crucible 3 and separated by insulator layers 11 and 12. The first two furnaces 7 and 8 are those habitually used in the prior art and make it possible to carry out a Brigdman solidification method, the upper furnace 7 being maintained at a temperature greater than that of the median furnace 8 and the interface between the crystal 2 and the liquid 1 being situated at the boundary between the furnaces 7 and 8. The lower furnace 9 is allocated to the heating of the gas in the ampoule 4 and the adjustment of its pressure by varying the temperature. The gas pressure in the top region 10 adjusts itself to the conditions of volume and temperature at this location, but an overpressure is maintained in the lower region of the crucible due to the higher heating of the contents of the ampoule 4. The sufficiency of this overpressure may be checked by examining the shape of the meniscus 6 formed by the liquid 1 at its join with the crystal 2: a concave meniscus is the proof of sufficient overpressure. The means of observation used may be an optic fibre 5 locally passing through the insulator layer 11. The lower furnace 9 is adjusted in order to make the heating it produces more or less intense as a function of the form of the meniscus 6. Finally, the reference 13 designates a labyrinth joint comprising chicanes that impose a sinuous pathway on the gas flows between the ampoule 4 and the lower region of the crucible 3, which is adjacent to the crystal 2, in order to impede the heat exchanges between these two volumes without being detrimental to pressure communications.

In a concrete example, a monocrystal of CdTe, 10 cm long and with a diameter of 5 cm was grown according to the Brigdman method. The crucible was made out of transparent silica glass and a monocrystalline seed with a diameter very slightly less than that of the crucible was placed under the material to be solidified. At the start of the solidification, the vapour tension of the liquid was 1.5 atmospheres in the upper region 10, which was heated to a temperature of around 1150° C. while the vapour pressure at the level of the meniscus 6 was one atmosphere at the melting temperature of CdTe at 1100°C. The pressure in the ampoule 4 therefore had to assure the pressure of 1.5 atmospheres in the upper region 10 and the overpressure in the lower region of the crucible 3 in order to form the contraction of the crystal 2 and the meniscus 6. Argon at 0.4 atmospheres was injected into the crucible 3 before it was sealed. Under these conditions, the ampoule 4 was heated to 1200° C. by means of the lower furnace 9 in order to make the device operate correctly.

The method according to the invention is compatible with the presence of an upper ingot to be liquefied and then solidified.

In the embodiment described, the furnaces 7, 8 and 9 can move along the crucible 3, the interface crystal 2—liquid 1 remaining at the height of the insulator layer 11 and the optic fibre 5, which makes it possible to achieve the solidification. The furnace 9 is designed to remain at the height of the ampoule 4; it may include stacked portions put into service by turns when they pass in front of the ampoule 4. It should also be noted that the ampoule 4 could remain immobile and be heated by a furnace separate from the furnaces for heating the body to be solidified; it would then be in communication with the crucible 3 via a flexible pipe.

What is claimed is:

1. A crystal growing device, comprising a crucible in which a liquid body is allowed to solidify to form a crystal and first means of heating surrounding the crucible in front of at least the liquid body, further comprising a gas ampoule that communicates with a lower portion of the crucible in such a way as to create a pressure difference between the lower portion and an upper region of the crucible overhanging the liquid and second means of adjustable heating surrounding the ampoule.

2. The crystal growing device according to claim 1, further comprising a thermal insulator between the first and second means of heating.

3. The crystal growing device according to claim 1, further comprising means for observing an interface between the liquid and the gas.

4. The crystal growing device according to claim 1, wherein the ampoule communicates with the crucible via a labyrinth passage.

5. The crystal growing method with a device conforming to claim 1, comprising a progressive solidification of the liquid body by an adjustment of the first means of heating and a creation of a gap between the solidified body and the crucible while establishing an overpressure in an interior region of the crucible, occupied by the solid body, compared to an upper region of the crucible, occupied by the gas, wherein the overpressure is caused by adjusting the second means of heating.

* * * * *